United States Patent
Uehling (10) Patent No.: US 8,994,190 B2
(45) Date of Patent: Mar. 31, 2015

(54) LOW-TEMPERATURE FLIP CHIP DIE ATTACH

(75) Inventor: Trent S. Uehling, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/477,764

(22) Filed: May 22, 2012

(65) Prior Publication Data

US 2013/0313726 A1   Nov. 28, 2013

(51) Int. Cl.
| | | |
|---|---|---|
| *H01L 21/56* | (2006.01) | |
| *H01L 23/498* | (2006.01) | |
| *H01L 23/00* | (2006.01) | |

(52) U.S. Cl.
CPC ........ *H01L 21/563* (2013.01); *H01L 23/49811* (2013.01); *H01L 24/11* (2013.01); *H01L 24/13* (2013.01); *H01L 24/16* (2013.01); *H01L 24/81* (2013.01); *H01L 2224/03912* (2013.01); *H01L 2224/05023* (2013.01); *H01L 2224/05166* (2013.01); *H01L 2224/05568* (2013.01); *H01L 2224/05647* (2013.01); *H01L 2224/11462* (2013.01); *H01L 2224/11472* (2013.01); *H01L 2224/13011* (2013.01); *H01L 2224/13017* (2013.01); *H01L 2224/13078* (2013.01); *H01L 2224/13082* (2013.01); *H01L 2224/13111* (2013.01); *H01L 2224/13147* (2013.01); *H01L 2224/14131* (2013.01);

(Continued)

(58) Field of Classification Search
USPC ........................ 257/777–778, 737, 686, 734
See application file for complete search history.

(56) References Cited

U.S. PATENT DOCUMENTS

| 5,137,461 | A | * | 8/1992 | Bindra et al. .................... 439/74 |
| 5,759,046 | A | * | 6/1998 | Ingraham et al. ............... 439/42 |
| 5,781,031 | A | * | 7/1998 | Bertin et al. .................... 326/39 |
| 5,897,341 | A | * | 4/1999 | Love et al. ..................... 438/125 |
| 5,918,794 | A | * | 7/1999 | D'Asaro et al. .......... 228/180.22 |
| 6,821,814 | B2 | * | 11/2004 | LaFontaine et al. .......... 438/108 |

(Continued)

OTHER PUBLICATIONS

Zhang et al.; "Fine pitch Cu/Sn solid state diffusion bonding for making high yield bump interconnections and its application in 3D integration"; Electronic System-Integration Technology Conference; Sep. 13-16, 2010; 4 Pgs; IEEE.

*Primary Examiner* — Marc Armand
(74) *Attorney, Agent, or Firm* — Jonathan N. Geld; Mary Jo Bertani (57) ABSTRACT

A mechanism for electrically coupling a semiconductor device die to a semiconductor device package substrate that avoids introduction of excessive temperature induced stresses to the semiconductor device die interconnect is provided. In one embodiment, the semiconductor device die is mechanically attached to the package substrate (or another semiconductor device die) at room temperature through the use of a plug-in socket or wedge connection having corresponding mating features formed on the die and substrate. The mechanical interconnect features can be formed on the die and substrate interconnects using an electroplating process. The surfaces of the semiconductor device die and package substrate can then be coupled using an underfill material. A low-temperature solid state bonding process can then be used to diffuse the materials forming the plug and socket features in order to form the electrical connection.

15 Claims, 6 Drawing Sheets

(52) U.S. Cl.
CPC ............... *H01L 2224/16145* (2013.01); *H01L 2224/16225* (2013.01); *H01L 2224/16227* (2013.01); *H01L 2224/73204* (2013.01); *H01L 2224/81141* (2013.01); *H01L 2224/81193* (2013.01); *H01L 2224/8183* (2013.01); *H01L 2924/00014* (2013.01); *H01L 2924/01074* (2013.01)
USPC ........... 257/777; 257/778; 257/737; 257/686; 257/734

(56) References Cited

U.S. PATENT DOCUMENTS

| | | | | |
|---|---|---|---|---|
| 6,864,570 | B2 * | 3/2005 | Smith | 257/703 |
| 7,557,432 | B2 * | 7/2009 | Tang et al. | 257/675 |
| 7,880,315 | B2 * | 2/2011 | Beyne et al. | 257/780 |
| 2006/0220259 | A1 * | 10/2006 | Chen et al. | 257/778 |
| 2010/0330743 | A1 * | 12/2010 | Yu et al. | 438/108 |

* cited by examiner

FIG. 15

LOW-TEMPERATURE FLIP CHIP DIE ATTACH

BACKGROUND

1. Field

This disclosure relates generally to semiconductor device packaging, and more specifically, to a mechanism to reduce localized stress in the area of electrical interconnects under a packaged device die.

2. Related Art

In certain types of semiconductor device packaging, semiconductor device die contacts are electrically coupled to a package substrate interconnect. Traditional methods of forming this coupling involve a solder reflow operation using solder bumps or solder-tipped metal columns formed on contacts of the semiconductor device die to contacts on the package substrate interconnect. These methods involve heating at least the contact region to temperatures sufficient to cause the solder to flow.

Issues have arisen in recent packaging development work on semiconductor die having lead-free solder bumps or solder-tipped metal columns, in which semiconductor die interlayer dielectric delamination occurs under the bumps or metal columns, known as white bumps or ghost bumps on large die/large packages. Delamination is a particular issue for semiconductor die using low-k and ultra-low-k dielectrics (e.g., films composed of silicon, carbon, oxygen, and hydrogen—SiCOH films) that tend to be more brittle due to their increased porosity. This delamination occurs, in part, due to differences in the coefficient of thermal expansion between the semiconductor device die material and the package substrate material. As the different materials cool down subsequent to solder reflow, a high stress occurs in the interconnect region, resulting in the delamination.

It is therefore desirable to provide a mechanism for electrically coupling a semiconductor device die to a semiconductor device package substrate that avoids introduction of excessive temperature induced stresses to the semiconductor device die interconnect.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for electrically coupling a semiconductor device die to a semiconductor device package substrate that avoids introduction of excessive temperature induced stresses to the semiconductor device die interconnect. In one embodiment, the semiconductor device die is mechanically attached to the package substrate (or another semiconductor device die) at room temperature through the use of a plug-in socket or wedge connection having corresponding mating features formed on the die and substrate. The mechanical interconnect features can be formed on the die and substrate interconnects using an electroplating process. The surfaces of the semiconductor device die and package substrate can then be coupled using an underfill material. A low-temperature solid state bonding process can then be used to diffuse the materials forming the plug and socket features in order to form the electrical connection. The combination of the mechanical nature of the connectors along with the underfill serve to reduce localized stresses experienced at the semiconductor device die interconnects.

During formation of a semiconductor device package, one or more semiconductor device die may be electrically coupled to an interconnect formed on a substrate for the semiconductor device package. A typical semiconductor device die is formed from a silicon substrate and has an interconnect formed using layers of metal and a dielectric material. As form factors of semiconductor device die have decreased, the use of lower dielectric coefficient dielectrics in the die interconnect (e.g., "low-k" and "ultra-low-k dielectrics) has increased. One feature of such low-k dielectric materials (e.g., SiCOH films and other porous silicon oxides) is that they can be more brittle than traditionally used dielectric materials due to enhanced porosity.

In a flip-chip type semiconductor device package, the package substrate is typically a glass reinforced epoxy resin (e.g., FR4 or bismaleimide-triazine [BT]). The semiconductor device package interconnect is built up on the package substrate and is used to electrically couple the various die and other structures of the package.

One concern in traditional packaging methods is a significant difference in the coefficient of thermal expansion (CTE) between the package substrate and the attached semiconductor device die. A typical CTE of the substrate material can be approximately 16 ppm, while a typical CTE of the semiconductor device die material is less than 3 ppm. Given that a traditional method of attaching the semiconductor device die to the package substrate is to heat the interconnect regions to cause solder to reflow (e.g., heating to greater than 230 C), the different CTEs cause different rates of contraction between the package substrate and the semiconductor device die as the connection cools and as a consequence significant stresses on the semiconductor device die interconnect. These stresses have been shown to cause cracking and other delamination effects in the low-k and ultra-low-k dielectrics used in the die interconnect. Traditional methods used to relieve stress require additional materials or significant additional steps during the process flow.

Embodiments of the present invention address the semiconductor device die interconnect stress issues by replacing the traditional solder ball or solder-tipped metal column connection structures with a set of metallic connectors that form a mechanical connection at room temperature and can form an electrical connection at a temperature lower than that used for solder (e.g., 150 C). The three dimensional metallic connectors can be formed using photolithographic and electroplating techniques. Materials used for these connectors can include, for example, copper and tin, which provide both strength and malleability, and exhibit solid-state diffusion sufficient to form a good electrical connection at lower temperatures.

In one embodiment, the metallic connectors can be formed in a "plug-and-socket" configuration, as will be discussed in greater detail below. In another embodiment, the metallic connectors can be formed in a "wedge" configuration, which will also be discussed below. On advantage of these types of connections is that they can be formed smaller than the typically-used solder balls, which will have the benefit of decreasing the size of both the die and package interconnects.

Figure 1:
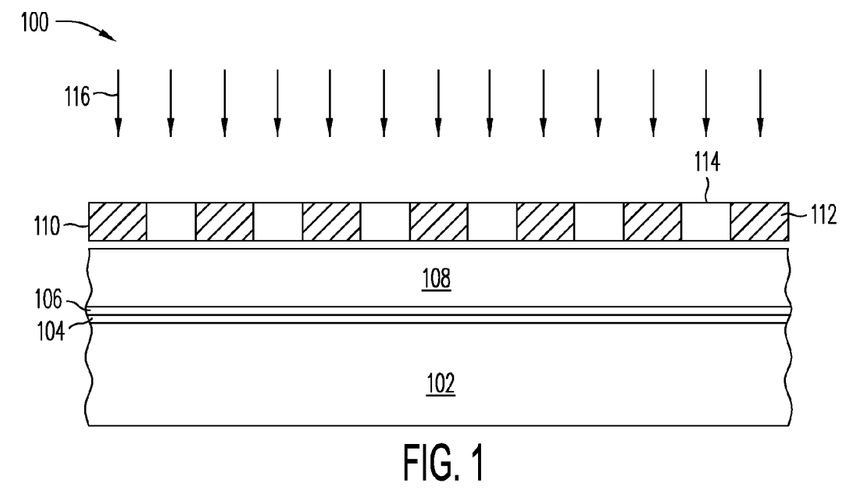
FIG. 1 is a simplified block diagram illustrating a cross-section of one stage of a process for forming a "plug" portion of a "plug-and-socket" connector, in accord with embodiments of the present invention.

FIG. 1 is a simplified block diagram illustrating a cross-section of one stage of a process for forming a "plug" portion of a "plug-and-socket" connector, in accord with embodiments of the present invention. In structure 100, a substrate 102 is provided on which a diffusion barrier 104 is formed. Substrate 102 can be either a semiconductor device package substrate or a semiconductor device die interconnect. It should be recognized that the "plug" of the "plug-and-socket" connector can be on either the semiconductor device die or the package substrate, with the corresponding "socket" on the other of the semiconductor device die or package substrate, depending on the nature of the application. In addition, embodiments of the present invention can electrically couple two semiconductor device die, so the "plug" and the "socket" will be formed on corresponding semiconductor device die. Embodiments of the present invention are not limited by the nature of the devices coupled.

Diffusion barrier 104 can be formed from a variety of appropriate materials, including, for example, titanium and titanium-tungsten. Diffusion barrier 104 is a thin layer of approximately 1000 Å and is typically formed using a sputtering process.

Subsequently, a plating bus 106 is formed over the diffusion barrier. The plating bus is typically formed from copper and is approximately 2000 Å. Again, the plating bus is typically formed using a sputtering process. A photoresist layer 108 is then formed over the plating bus. A variety of photoresist materials known in the art can be used, including, for example, PMMA, PMGI, phenol formaldehyde resin, and epoxy-based photoresists. Photoresist layer 108 can be applied in a manner acceptable for the type of photoresist, as known in the art. In one embodiment, a photoresist layer 108 is applied as a liquid and spin-coated to ensure a uniform thickness over a panel including the underlying layers. Alternate photoresist materials can be applied as a laminated dry film. After curing, the thickness of the photoresist layer should be greater than the final desired height of the features to be formed (e.g., greater than 20-80 microns). The photoresist material can be a positive or negative photoresist.

A photo mask 110 is then used to pattern photoresist layer 108. Typical photo masks are glass with a metallic plating that only allows light (116) to interact with the photoresist in desired areas.

Figure 2:
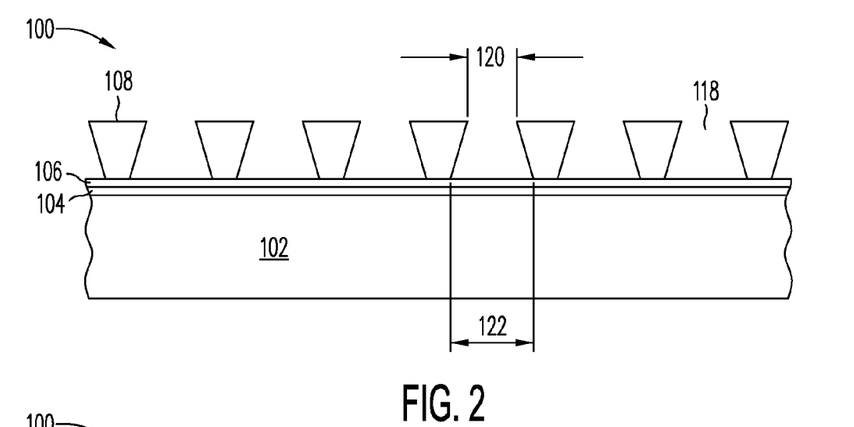
FIG. 2 is a simplified block diagram illustrating a cross-section of a stage of the process for forming a "plug" portion of a "plug-and-socket" connector subsequent to that of FIG. 1, in accord with embodiments of the present invention.

FIG. 2 is a simplified block diagram illustrating a cross-section of a stage of the process for forming a "plug" portion of a "plug-and-socket" connector subsequent to that of FIG. 1, in accord with embodiments of the present invention. Exposed portions of photoresist layer 108 have been removed (e.g., photoresist layer 108 is a positive photoresist). For proper contact between the ultimately formed plugs and sockets, it is desirable that the plugs have tapered sides. To form the tapered sides, the positive photoresist is over-exposed, thereby causing photoresist hole 118 to have a hole top dimension 120 of a smaller size than a hole bottom dimension 122.

If the photoresist was a negative photoresist, then the photo mask is formatted to allow light to interact with the areas of photoresist desired to be retained, rather than removed. In addition, a normal exposure or an under exposure could be used to provide the desired tapering of the photoresist structures shown in FIG. 2.

Figure 3:
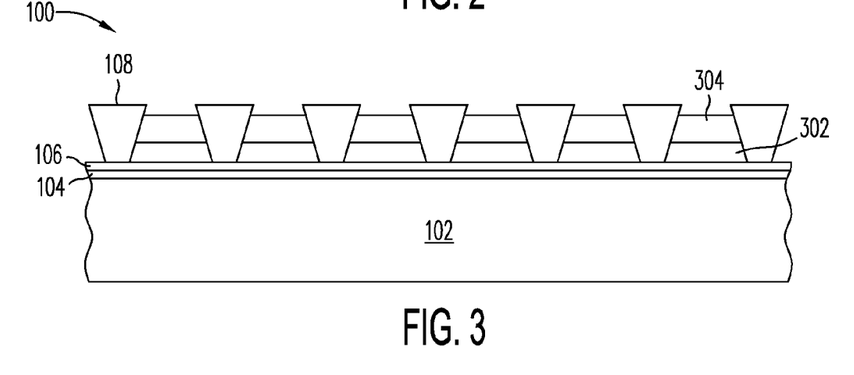
FIG. 3 is a simplified block diagram illustrating a cross-section of a stage of the process for forming a "plug" portion of a "plug-and-socket" connector subsequent to that of FIG. 2, in accord with embodiments of the present invention.

FIG. 3 is a simplified block diagram illustrating a cross-section of a stage of the process for forming a "plug" portion of a "plug-and-socket" connector subsequent to that of FIG. 2, in accord with embodiments of the present invention. An electroplating process is performed to form metallic layers 302 and 304 in the holes (118) previously formed in photoresist layer 108. A first electroplate layer 302 is formed to establish contact with the interconnect layers of substrate 102 through the diffusion barrier 104 and plating bus 106. In one embodiment, first electroplate layer 302 includes copper. Depending on the nature of the application, first electroplate layer 302 can extend for a fraction of the depth of photoresist hole 118 or can extend to the desired height of the entire plug. That is, the plug can be formed entirely of the material of the first electroplate layer (e.g., copper). If the application calls for a second material to be included in the plug, then a second electroplating step can be performed that forms second electroplate layer 304. In one embodiment, second electroplate layer 304 includes tin. Standard electroplating techniques known in the art can be used to form the first and second electroplate layers. The depth of the electroplate layers is typically kept below that of photoresist hole (e.g., 118) to avoid shorting.

Figure 4:
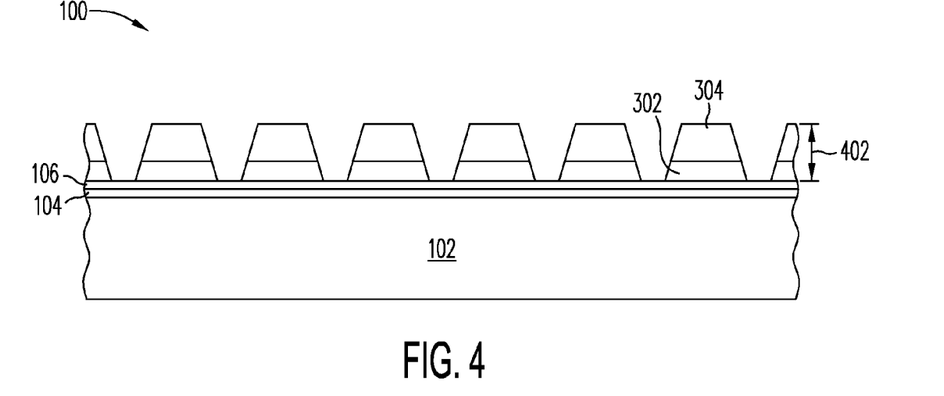
FIG. 4 is a simplified block diagram illustrating a cross-section of a stage of the process for forming a "plug" portion of a "plug-and-socket" connector subsequent to that of FIG. 3, in accord with embodiments of the present invention.

FIG. 4 is a simplified block diagram illustrating a cross-section of a stage of the process for forming a "plug" portion of a "plug-and-socket" connector subsequent to that of FIG. 3, in accord with embodiments of the present invention. In FIG. 4, photoresist layer 108 is removed using, for example, a chemical removal process known in the art. The metal structures remaining form a portion of the plugs. Embodiments provide for the plug height 402 to be between 20-80 microns, although heights can be below 20 microns and above 80 microns. It may be advantageous to have a height of the metallic features to be lower in order to reduce the electroplating time and thereby reduce the impact of the feature formation on overall processing time. Alternatively, taller features may ultimately allow for more reliable electrical connectivity in the final assembly.

Figure 5:
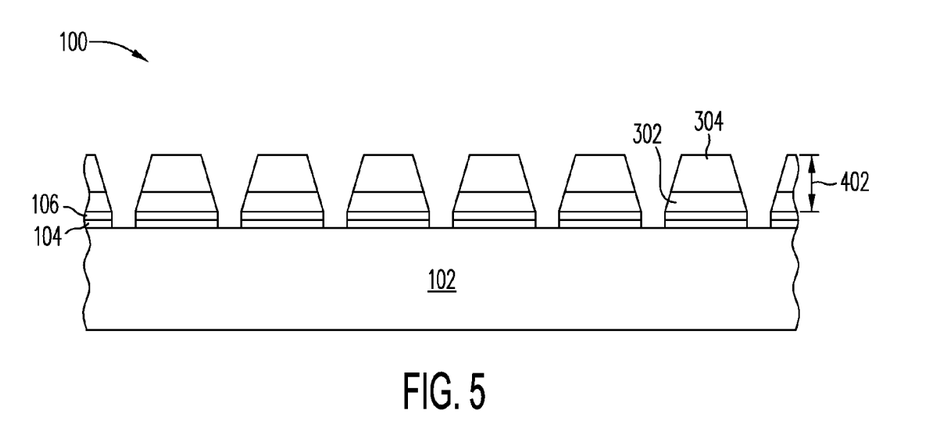
FIG. 5 is a simplified block diagram illustrating a cross-section of a stage of the process for forming a "plug" portion of a "plug-and-socket" connector subsequent to that of FIG. 4, in accord with embodiments of the present invention.

FIG. 5 is a simplified block diagram illustrating a cross-section of a stage of the process for forming a "plug" portion of a "plug-and-socket" connector subsequent to that of FIG. 4, in accord with embodiments of the present invention. FIG. 5 illustrates a removal of exposed regions of copper plating bus 106 and diffusion barrier 104 between the plug features. These exposed metal areas are removed in order to eliminate electrical shorting between the plugs. In one embodiment, the copper plating bus is removed using a wet chemical etch, while the diffusion barrier is removed using a dry etch process.

Subsequent to the removal of the plating bus and diffusion barrier, the features on structure 100 are the "plugs" for the "plug-and-socket" connector. A similar set of steps are performed in order to form the corresponding "sockets" on the to-be-mated structure. A primary difference is in the patterning of the photoresist in order to achieve a desired socket structure.

Figure 6:
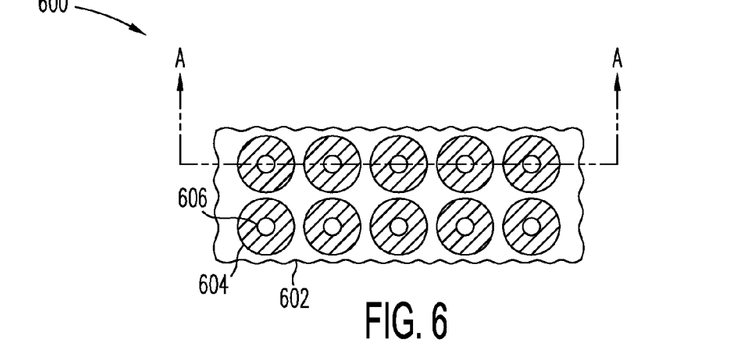
FIG. 6 is a simplified block diagram illustrating a top view of one example of a "socket" portion of a "plug-and-socket" connector, in accord with embodiments of the present invention.

FIG. 6 is a simplified block diagram illustrating a top view of one example of a "socket" portion of a "plug-and-socket" connector, in accord with embodiments of the present invention. In structure 600, socket features 604 are formed on a substrate 602. As with the plug features described above, substrate 602 can be either a semiconductor device package substrate or a semiconductor device die interconnect. Socket features 604 include a socket hole 606 configured to receive a corresponding plug feature. As with the "plug" feature, socket features 604 are a conductive material, and in one embodiment can be copper.

Figure 7:
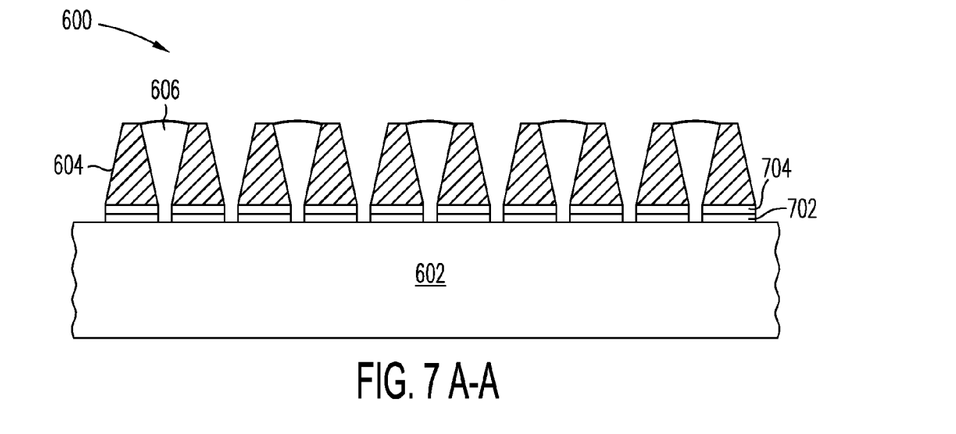
FIG. 7 is a simplified block diagram illustrating a cross-section of the socket features of FIG. 6 through a plane A-A, in accord with embodiments of the present invention.

FIG. 7 is a simplified block diagram illustrating a cross-section of the socket features of FIG. 6 through a plane A-A, in accord with embodiments of the present invention. As with the plug features, socket features 604 are formed on a substrate 602 and include a diffusion barrier 702 and a remaining plating bus 704, subsequent to the etching steps used to remove the exposed diffusion barrier and electroplate layer between the socket structures and in holes 606 of the socket structures. In addition, as with the plug structures above, socket structures 604 can be formed of one or more metals.

In one embodiment, socket structures 604 include a monolithic copper structure if the corresponding plug structure includes both copper and tin. In another embodiment, if the plug is a monolithic copper structure, then socket structures 604 can include a copper layer and a tin layer. As will be discussed more fully below, inclusion of a tin layer in at least one of the plug or socket can be desirable in order to form a reliable electrical coupling. Alternatively, both the socket and the plug can be entirely copper, entirely tin, or a combination of copper and tin layers.

Figure 8:
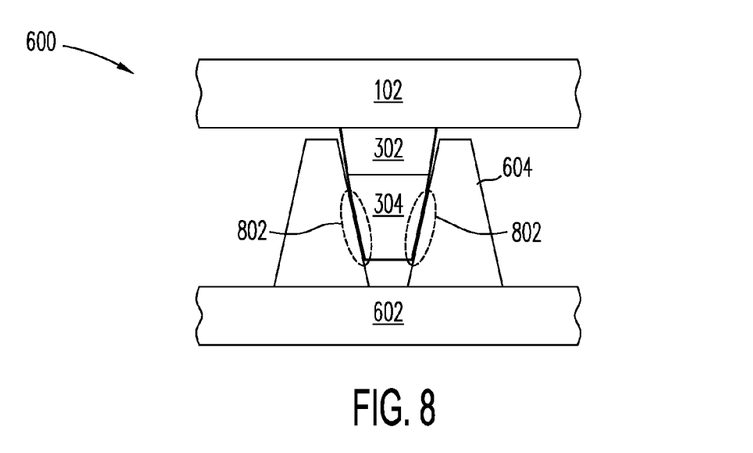
FIG. 8 is a cross-sectional illustration of one embodiment of a plug-and-socket coupling, in accord with embodiments of the present invention.

FIG. 8 is a cross-sectional illustration of one embodiment of a plug-and-socket coupling, in accord with embodiments of the present invention. Substrates 102 and 602 are coupled via insertion of a plug feature formed from metallic layers 302 and 304 into a socket feature formed from metallic layer 604. As illustrated, metallic layer 304 contains tin and is in contact with the socket feature at contact region 802. The plug and socket are tapered such that contact region 802 is near the bottom of the socket hole.

As the plug feature is inserted into the socket feature, pressure can be applied. As illustrated, dimensions of the tin portion of the plug are such that the tin region of the plug deforms as it enters the narrower area of the socket. This deformation increases the area of the contact region between the socket and the plug.

Figure 9:
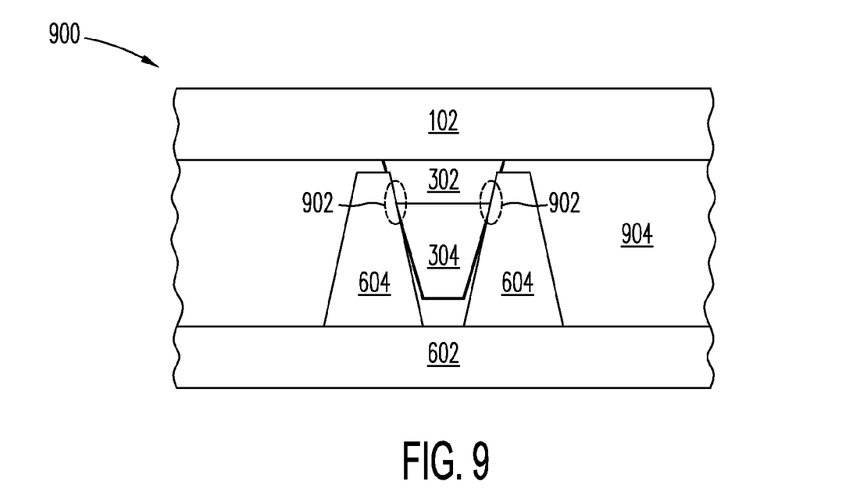
FIG. 9 is a cross-sectional illustration of an alternate embodiment of a plug-and-socket coupling, in accord with embodiments of the present invention.

FIG. 9 is a cross-sectional illustration of another embodiment of a plug-and-socket coupling, in accord with embodiments of the present invention. As with FIG. 8, in structure 900, substrates 102 and 602 are coupled via insertion of a plug feature formed from metallic layers 302 and 304 into a socket feature formed from metallic layer 604. In the example of FIG. 9, the plug and socket are tapered such that contact region 902 is near the top of the socket hole. Again, the dimensions of the tin portion of the plug (304) are such that the tin region deforms as it comes in contact with the surface of the socket hole, thereby increasing the area of the contact region between the socket and the plug.

FIG. 9 also illustrates an addition of an underfill layer 904 between substrates 102 and 602. In one embodiment, underfill layer 904 can be a silica-filled epoxy resin that adheres to the surfaces of both substrates and the connectors. One feature of underfill layer 904 is that it provides another mechanism to hold the substrates together, thereby reducing stresses incurred at the connectors. Underfill layer 904 also protects the surfaces of the connectors and substrates from effects of moisture and oxygen.

Figure 10:
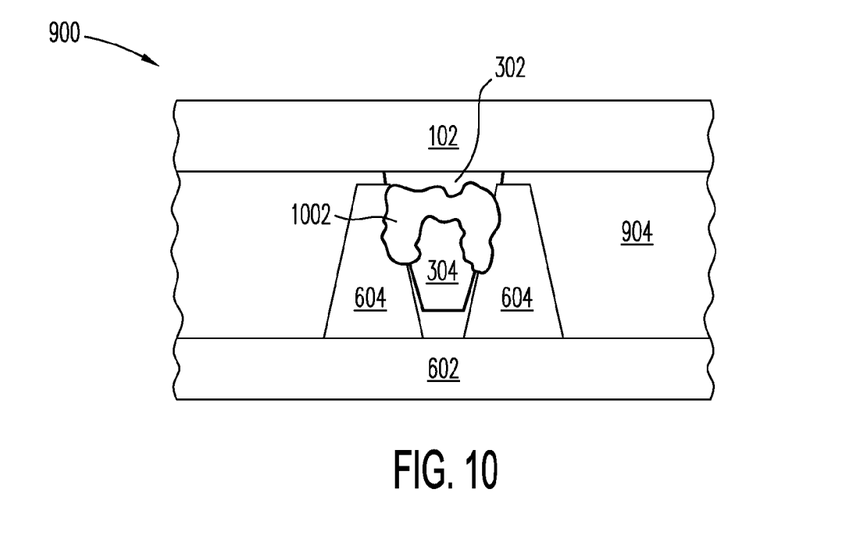
FIG. 10 is a cross-sectional illustration of a subsequent stage of processing for the embodiment of the plug-and-socket coupling of FIG. 9, in accord with embodiments of the present invention.

FIG. 10 is a cross-sectional illustration of a subsequent stage of processing for the embodiment of the plug-and-socket coupling of FIG. 9, in accord with embodiments of the present invention. In FIG. 10, an improved electrical contact between the surfaces of the plug and socket is generated by forming a solid-state diffusion region 1002. Solid-state diffusion region 1002 is formed by application of heat for a period of time. The solid-state diffusion region includes a combination of tin and copper atoms in varying concentrations. In one embodiment, heat of about 150 C is applied for approximately 20 minutes. While increased temperature allows for formation of the diffusion region over a shorter period of time, the stresses associated with higher temperatures approaching those used in solder reflow operations (e.g., greater than 230 C) are sought to be avoided. The formation of diffusion region 1002 provides a solid metallic connection between the plug and the socket hole surfaces, which results in an enhanced electrical contact (e.g., low resistance).

Figure 11:
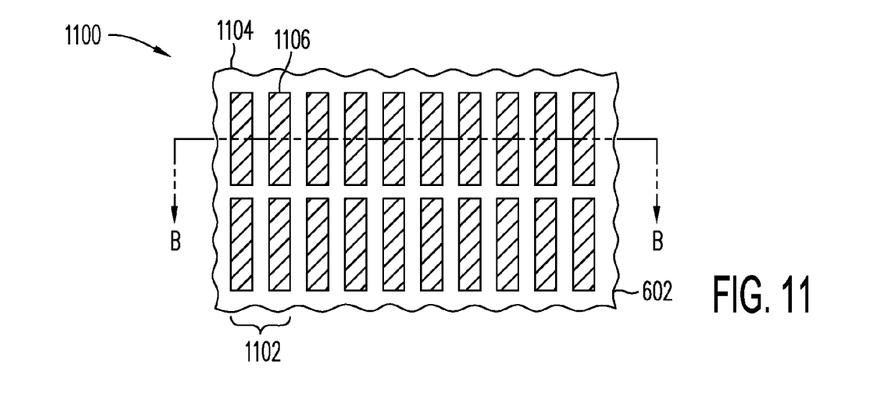
FIG. 11 is a simplified block diagram illustrating an alternative embodiment of connection features, in accord with embodiments of the present invention.

FIG. 11 is a simplified block diagram illustrating an alternative embodiment of connection features, in accord with embodiments of the present invention. FIG. 6 illustrates a socket feature having a hole into which the plug is inserted. Connector features 1104 and 1106 of structure 1100 provide a wedge-type connector. Each connector feature 1104 and 1106 is a tapered shape formed on substrate 602. Two of the connector features form a receiving structure 1102 for a corresponding single connector feature.

Figure 12:
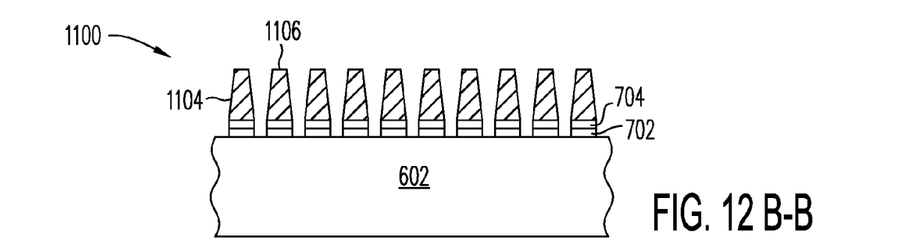
FIG. 12 is a simplified block diagram illustrating the wedge-type connectors of FIG. 11 at a cross-section B-B.

FIG. 12 is a simplified block diagram illustrating the wedge-type connectors of FIG. 11 at a cross-section B-B. As discussed above, connector features 1104 and 1106 are tapered in a manner similar to that illustrated for the cross section of socket feature 604, and provide a similar connectivity. As with the previously discussed plug and socket, connector features 1104 and 1106 can be a monolithic metal or a combination of metal layers.

Use of a plug-and-socket configuration or a wedge connector configuration depends upon the application. In some applications, a wedge may be easier to process during assembly. But the wedge feature may need to have increased lateral dimensions in order to provide sufficient surface area to provide a low resistance electrical connection. Such surface area can be provided in a smaller area using a plug-and-socket connection.

Figure 13:
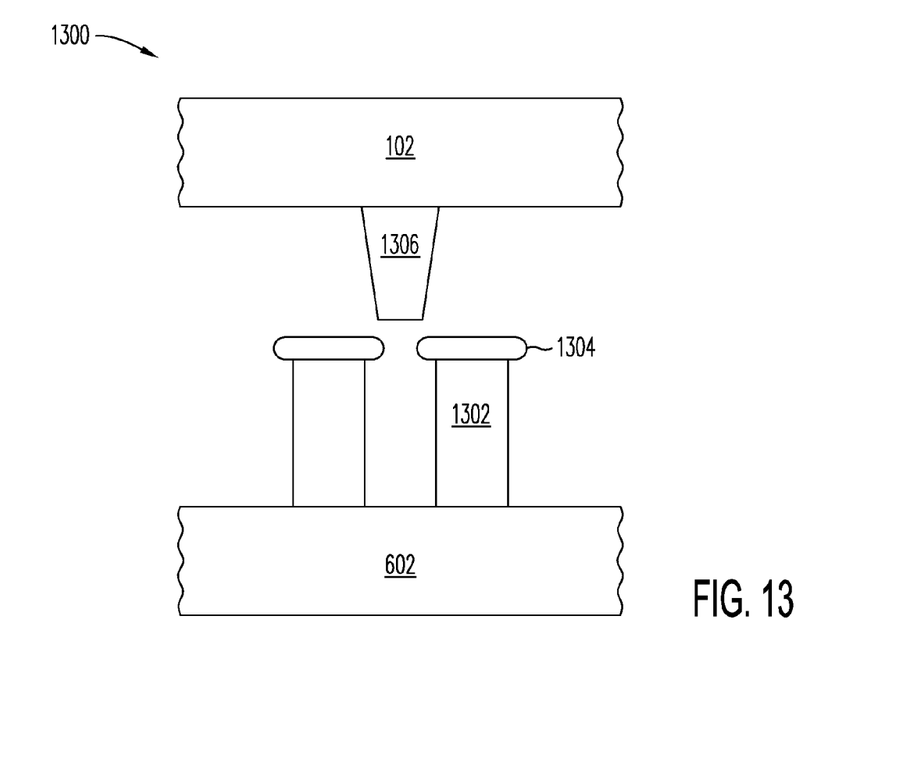
FIG. 13 is a simplified block diagram of a cross section of an alternative connector structure, in accord with embodiments of the present invention.

FIG. 13 is a simplified block diagram of a cross section of an alternative connector structure 1300, in accord with embodiments of the present invention. Structure 1300 has a plug-and-socket connector formed on substrate 602 and includes a socket layer 1302 having straight sides in the hole region. In one embodiment, socket layer 1302 can be formed from copper using electroplating techniques discussed above. A socket cap layer 1304 is formed on socket layer 1302. Socket cap layer 1304 can be formed by electroplating to a thickness above that of a height of the patterned photoresist used in forming socket layer 1302. In this manner, edges of socket cap layer 1304 overhang the opening of the socket hole. Socket cap layer 1304 can be formed from the same or different metal than that used for socket layer 1302. In one embodiment, socket cap layer 1304 is formed from tin.

A plug feature 1306 is formed on substrate 102. As with the plug described above, plug feature 1306 can be formed from one or more metal layers. Plug feature 1306 is formed having a taper, using the photolithographic techniques described above with regard to FIGS. 1-3.

Figure 14:
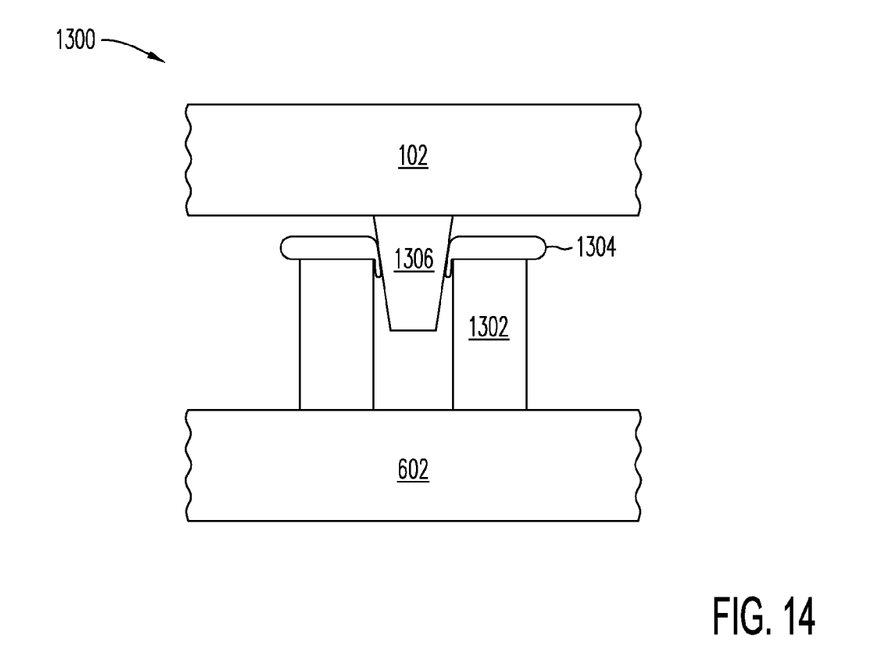
FIG. 14 is a simplified block diagram of a cross section of the alternative connector structure of FIG. 13 at a stage after the plug feature is inserted into the socket, in accord with embodiments of the present invention.

FIG. 14 is a simplified block diagram of a cross section of the alternative connector structure of FIG. 13 at a stage after the plug feature is inserted into the socket, in accord with embodiments of the present invention. As tapered plug feature 1306 enters the socket hole, socket cap layer 1304 is deformed down the sides of both the interior of the socket hole (e.g., along sides of socket layer 1302) and plug feature 1306. The tapering of the plug feature, along with the overhanging cap material, ensures a good metal-on-metal contact for subsequent solid-state diffusion to form a low resistance electrical coupling between the plug feature and the socket material. In one embodiment, deformation of the cap material occurs at a temperature below 50° C.

Figure 15:
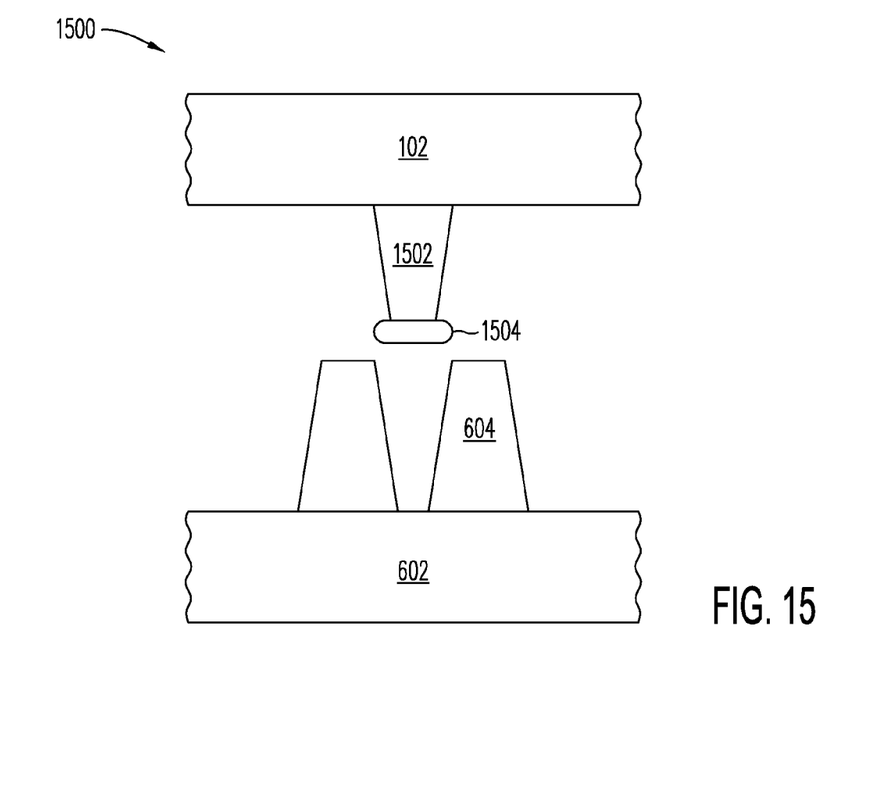
FIG. 15 is a simplified block diagram of a cross section of another alternative connector structure, in accord with embodiments of the present invention.

FIG. 15 is a simplified block diagram of a cross section of another alternative connector structure 1500, in accord with embodiments of the present invention. Connector structure 1500 has a plug-and-socket connector formed on substrate 602 and includes a socket feature 604, as described above with regard to FIG. 6. A plug feature is formed on substrate 102 and has a plug layer 1502 with straight sides. Plug layer 1502 can be formed of a monolithic metal (e.g., copper), using electroplating methods discussed above. A plug cap layer 1504 is formed on plug layer 1502. Plug cap layer 1304 can be formed by electroplating to a thickness above that of a height of the patterned photoresist used in forming plug layer 1502. In this manner, edges of plug cap layer 1504 overhang plug layer 1502. Socket cap layer 1504 can be formed from the same or different metal than that used for plug layer 1502. In one embodiment, plug cap layer 1504 is formed from tin.

As the plug feature is inserted into the socket hole, the tapered edges of the socket hole deform the plug cap layer in a manner similar to that discussed above with regard to FIG. 14. Again, the deformation of the plug cap layer provides an enhanced metal-on-metal contact for subsequent solid-state diffusion in order to form a low-resistance electrical coupling between the plug feature and the socket.

Embodiments of the present invention provide for an improved mechanical and electrical coupling between elements of a semiconductor device package. Metallic connectors are formed on interconnects that permit low electrical resistance coupling at low temperatures. This thereby avoids mechanical stress issues associated with high temperature connections and subsequent cooling of the structure, which are of significant concern when using low-k dielectric materials in forming the semiconductor die interconnect. Effective connections can be made using various forms of connectors, and photolithographic and electroplating techniques can be advantageously used to provide a wide variety of connector forms.

By now it should be appreciated that, in one embodiment of the present invention, there has been provided a semiconductor device that includes a first substrate, a first set of conductive contacts disposed on an external side of the first substrate, a second substrate, and a second set of conductive contacts on an external side of the second substrate. At least a portion of each of the first set of conductive contact fits within a corresponding one of the second set of conductive contacts and the first and second conductive contacts are diffusion bonded with one another.

In one aspect of the above embodiment, the first set of contacts are configured as plugs and the second set of contacts are configured as sockets for the plugs. At least a portion of a plug contacts at least a portion of the corresponding socket when the plugs and sockets are engaged. In another aspect of the above embodiment, the first set of contacts are configured as sockets and the second set of contacts are configured as plugs for the sockets. Again, at least a portion of a plug contacts at least a portion of the corresponding socket when the plugs and sockets are engaged.

In another aspect of the above embodiment, the first and second sets of contacts have tapered sidewalls. In another aspect of the above embodiment, at least one of the groups consisting of the first set of contacts and the second set of contacts have contacts with tapered sidewalls. In still another aspect of the above embodiment, at least one of the groups consisting of the first set of contacts in the second set of contacts include two different conductive materials. In another aspect of the above embodiment, the first and second set of contacts diffuse with one another at a temperature below 230° C. In another aspect of the above embodiment, the first substrate is one of a group consisting of a substrate for integrated circuit die in a package substrate, and the second substrate is one of a group consisting of a substrate for an integrated circuit die and a package substrate.

Another embodiment of the present invention provides a semiconductor device including a first surface, a first set of contacts formed on an external side of the first surface, a second surface, and a second set of contacts formed on an external side of the second surface. A portion of each of the first set of contacts fits within a respective one of the second set of contacts.

In one aspect of the above embodiment, one or more of the first set of contacts are configured as of a group consisting of a circular plug, a set of wedges, and a set of pillars. In a further aspect, corresponding contacts of the second set of contacts are configured as of the group consisting of an annular socket when the first set of contacts are configured as the circular plug, and a wedge when the first set of contacts are configured as the set of wedges or the set of pillars. In another further aspect, the circular plug includes tapered sidewalls and each of the second set of contacts is an annular socket having tapered sidewalls that have dimensions so that a thickness of at least a portion of the tapered sidewalls of the circular plug are larger than the dimension of a portion of an opening in the annular socket. In another further aspect, the set of wedges includes tapered sidewalls, and a thickness of at least a portion of each of the second set of contacts is dimensions so that the thickness is larger than the dimension of an opening between the tapered sidewalls.

In another aspect of the above embodiment, a deformable conductive material is formed on and extending beyond sides of the tip of at least one of the first set of contacts or the second set of contacts. The deformable conductive material is deformable at a temperature below 50° C. In another aspect of the above embodiment, one or more of the first set of contacts and the second set of contacts includes two different conductive materials. In still another aspect of the above embodiment, the first and second set of contacts diffuse with one another at a temperature below 230° C. In yet another aspect of the above embodiment, the first surface is one of a topside integrated circuit die in a package substrate, and the second surface is one of the top side of integrated circuit die and a package substrate.

Another embodiment of the present invention provides for mating conductive contacts on an external surface of a first component of a semiconductor device with conductive contacts on an external surface of a second component of the semiconductor device, introducing an underfill material between the external surfaces, and curing the underfill material. At least a portion of the contacts on the first component fit within and contact at least a portion of a respective one of the conductive contacts of the second component. One aspect of this embodiment further exposing the mated contacts to a temperature below 230 degrees Centigrade until a diffusion region is created between the mated contacts. Another aspect of this embodiment provides that the mating of the conductive contacts includes deforming a portion of the contacts on the external surface of the first component to fit within the contacts of the second component.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, shapes of plugs and sockets can be altered, as well as the component associated with a plug or socket. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    a first substrate;
    a first set of conductive contacts disposed on an external side of the first substrate, wherein the first set of conductive contacts comprises a deformable material configured to deform at a temperature below 230 C.;
    a second substrate;
    a second set of conductive contacts on one external side of the second substrate, wherein
        at least a portion of each of the first set of conductive contacts fits within a corresponding one of the second set of conductive contacts;
    a contact area between the deformable material of the first set of conductive contacts and corresponding each of the second set of conductive contacts; and
    a diffusion bonded region between the first and second conductive contacts at least at the contact area.

2. The semiconductor device of claim 1, wherein
    the first set of contacts are configured as plugs,
    the second set of contacts are configured as sockets for the plugs, and
    at least a portion of each of the plugs contacts at least a portion of the corresponding socket when the plugs and sockets are engaged.

3. The semiconductor device of claim 1, wherein
    the first set of contacts are configured as sockets,
    the second set of contacts are configured as plugs for the sockets, and
    at least a portion of each of the plugs contacts at least a portion of the corresponding socket when the plugs and sockets are engaged.

4. The semiconductor device of claim 1, wherein the first and second sets of contacts have tapered sidewalls.

5. The semiconductor device of claim 1, wherein one or more of the first set of contacts and the second set of contacts comprise contacts with tapered sidewalls.

6. The semiconductor device of claim 1, wherein one or more of the first set of contacts and the second set of contacts comprise two different conductive materials.

7. The semiconductor device of claim 1, wherein the first and second set of contacts diffuse with one another at a temperature below 230 degrees Centigrade.

8. The semiconductor device of claim 1, wherein
    the first substrate is one of the group consisting of: a substrate for an integrated circuit die and a package substrate, and
    the second substrate is one of the group consisting of: a substrate for an integrated circuit die and a package substrate.

9. A semiconductor device comprising:
a first surface;
a first set of contacts formed on an external side of the first surface, wherein one or more of the first set of contacts are configured as one of the group consisting of: a circular plug and a set of pillars;
a second surface; and
a second set of contacts formed on an external side of the second surface, wherein
a portion of each of the first set of contacts fits within a respective one of the second set of contacts.

10. The semiconductor device of claim 9, wherein one or more of the second set of contacts are configured as one of the group consisting of:
an annular socket when a corresponding contact from the first set of contacts is configured as the circular plug, and
a wedge when a corresponding set of contacts from the first set of contacts is configured as the set of pillars.

11. The semiconductor device of claim 9, wherein
the circular plug comprises tapered sidewalls, and
each of the second set of contacts is an annular socket comprising tapered sidewalls that are dimensioned so that a thickness of at least a portion of the tapered sidewalls of the circular plug are larger than the dimension of a portion of an opening in the annular socket.

12. The semiconductor device of claim 9 further comprising:
a deformable conductive material formed on and extending beyond sides of a tip of at least one of the first set of contacts or the second set of contacts, wherein the deformable conductive material is deformable at a temperature below 50 degrees Centigrade.

13. The semiconductor device of claim 9, wherein one or more of the first set of contacts and the second set of contacts comprises two different conductive materials.

14. The semiconductor device of claim 9, wherein the first and second set of contacts diffuse with one another at a temperature below 230 degrees Centigrade.

15. The semiconductor device of claim 9, wherein
the first surface is one of a top side of an integrated circuit die and a package substrate, and
the second surface is one of a top side of an integrated circuit die and a package substrate.

* * * * *